(12) United States Patent
Sullivan

(10) Patent No.: US 8,717,051 B2
(45) Date of Patent: May 6, 2014

(54) METHOD AND APPARATUS FOR ACCURATELY MEASURING CURRENTS USING ON CHIP SENSE RESISTORS

(75) Inventor: Patrick Sullivan, Sonoma, CA (US)

(73) Assignee: Intersil Americas Inc., Milpitas, CA (US)

( * ) Notice: Subject to any disclaimer, the term of this patent is extended or adjusted under 35 U.S.C. 154(b) by 1008 days.

(21) Appl. No.: 12/760,174

(22) Filed: Apr. 14, 2010

(65) Prior Publication Data

US 2011/0095818 A1    Apr. 28, 2011

Related U.S. Application Data

(60) Provisional application No. 61/253,904, filed on Oct. 22, 2009.

(51) Int. Cl.
G01R 31/00 (2006.01)
G01R 1/20 (2006.01)

(52) U.S. Cl.
CPC *G01R 1/20* (2013.01); *G01R 1/203* (2013.01); *Y10S 323/907* (2013.01)
USPC ............. 324/750.3; 324/750.03; 324/762.01; 324/762.02; 323/314; 323/315; 323/316; 323/907

(58) Field of Classification Search
CPC ............ G01R 1/20; G01R 1/203; G05F 1/10
USPC ............... 324/750.03, 750.3, 762.01–762.02; 323/314–316, 907
See application file for complete search history.

(56) References Cited

U.S. PATENT DOCUMENTS

| | | | | |
|---|---|---|---|---|
| 4,277,749 A | * | 7/1981 | Traub | 324/126 |
| 4,963,802 A | | 10/1990 | Gross et al. | |
| 5,059,892 A | * | 10/1991 | Stoft | 324/73.1 |
| 5,063,344 A | * | 11/1991 | Linke | 324/115 |
| 5,563,541 A | * | 10/1996 | Koga et al. | 327/380 |

(Continued)

FOREIGN PATENT DOCUMENTS

CN            101330252        12/2008

OTHER PUBLICATIONS

Kumath, et al., A 99% Precise Digitally Controlled Potentiometer, IEC 2008 Session III / Precision Analog / III.2 Dec. 3, 2008 / 3.15pm-3.45pm, 12 pages, Copyright 2008 Intersil Americas Inc.

(Continued)

*Primary Examiner* — Patrick J Assouad
*Assistant Examiner* — Lamarr Brown
(74) *Attorney, Agent, or Firm* — Fogg & Powers LLC

(57) ABSTRACT

Systems and methods for managing process and temperature variations for on-chip sense resistors are disclosed. The system includes a circuit that can leverage a linear gm circuit in order to provide linear gains (positive gains and/or negative gains). The linearity of the circuit enables compensation for temperature and process variations across an entire range of current (positive to negative). A control signal is generated by using a linear gm amplifier and a replica resistor, which is substantially similar to the on chip resistor. The control signal is used to control the gain of a disparate linear gm amplifier within a compensation circuit, which provides an offset voltage to compensate for the variation in resistance of the on chip resistor.

7 Claims, 10 Drawing Sheets

(56) References Cited

U.S. PATENT DOCUMENTS

| | | | |
|---|---|---|---|
| 5,723,974 A | 3/1998 | Gray | |
| 5,804,979 A * | 9/1998 | Lund et al. | 324/713 |
| 5,867,056 A | 2/1999 | Zoellick | |
| 5,917,318 A * | 6/1999 | Kamata | 324/762.01 |
| 6,028,426 A * | 2/2000 | Cameron et al. | 324/126 |
| 6,230,276 B1 * | 5/2001 | Hayden | 713/320 |
| 6,448,853 B1 | 9/2002 | Harvey | |
| 6,459,246 B1 | 10/2002 | Roo | |
| 6,801,033 B2 * | 10/2004 | Sudo et al. | 324/750.3 |
| 6,965,247 B2 * | 11/2005 | Nadal Guardia | 324/750.3 |
| 6,992,526 B2 * | 1/2006 | Cheng | 330/9 |
| 7,085,977 B2 * | 8/2006 | Marshall et al. | 714/726 |
| 7,373,574 B2 * | 5/2008 | Kojima | 714/738 |
| 7,504,847 B2 * | 3/2009 | Goodnow et al. | 324/762.01 |
| 7,849,426 B2 * | 12/2010 | Goodnow et al. | 716/106 |
| 8,050,642 B2 * | 11/2011 | Kim et al. | 455/234.1 |
| 2001/0003419 A1 * | 6/2001 | Ribes | 324/126 |
| 2001/0005161 A1 | 6/2001 | Yeong | |
| 2005/0195024 A1 | 9/2005 | Cheng | |
| 2006/0049856 A1 * | 3/2006 | Nakai et al. | 327/83 |
| 2006/0220740 A1 * | 10/2006 | Bessho et al. | 330/252 |
| 2006/0232266 A1 * | 10/2006 | Kelly | 324/158.1 |
| 2006/0259256 A1 * | 11/2006 | Roach | 702/64 |
| 2006/0267592 A1 * | 11/2006 | Choi | 324/426 |
| 2007/0263334 A1 * | 11/2007 | Nishida | 361/103 |
| 2008/0048703 A1 * | 2/2008 | Yamaguchi | 324/763 |
| 2008/0094092 A1 * | 4/2008 | Goodnow et al. | 324/765 |
| 2008/0157798 A1 * | 7/2008 | Greenberg et al. | 324/760 |
| 2009/0002056 A1 * | 1/2009 | Doyle et al. | 327/512 |
| 2010/0321050 A1 * | 12/2010 | Agarwal et al. | 324/750.3 |
| 2011/0148445 A1 * | 6/2011 | Zivkovic et al. | 324/750.3 |
| 2012/0218022 A1 * | 8/2012 | Lazarov et al. | 327/362 |
| 2012/0249098 A1 * | 10/2012 | Popescu et al. | 323/265 |

OTHER PUBLICATIONS

Chinese Patent Office, "Office Action", "from Foreign Counterpart of U.S. Appl. No. 12/760,174", Jan. 24, 2013, pp. 1-9, Published in: CN.

The State Intellectual Property Office of the People'S Republic of China, "Second Office Action", "from Foreign Counterpart of U.S. Appl. No. 12/760,174", Oct. 10, 2013, pp. 1-14, Published in: CN.

* cited by examiner

METHOD AND APPARATUS FOR ACCURATELY MEASURING CURRENTS USING ON CHIP SENSE RESISTORS

CROSS-REFERENCE TO RELATED APPLICATIONS

This application claims the benefit of U.S. Provisional Patent Application Ser. No. 61/253,904, filed on Oct. 22, 2009, and entitled "METHOD AND APPARATUS FOR ACCURATELY MEASURING CURRENTS USING ON CHIP SENSE RESISTORS", which is incorporated herein by reference in its entirety.

DETAILED DESCRIPTION

Figure 1:
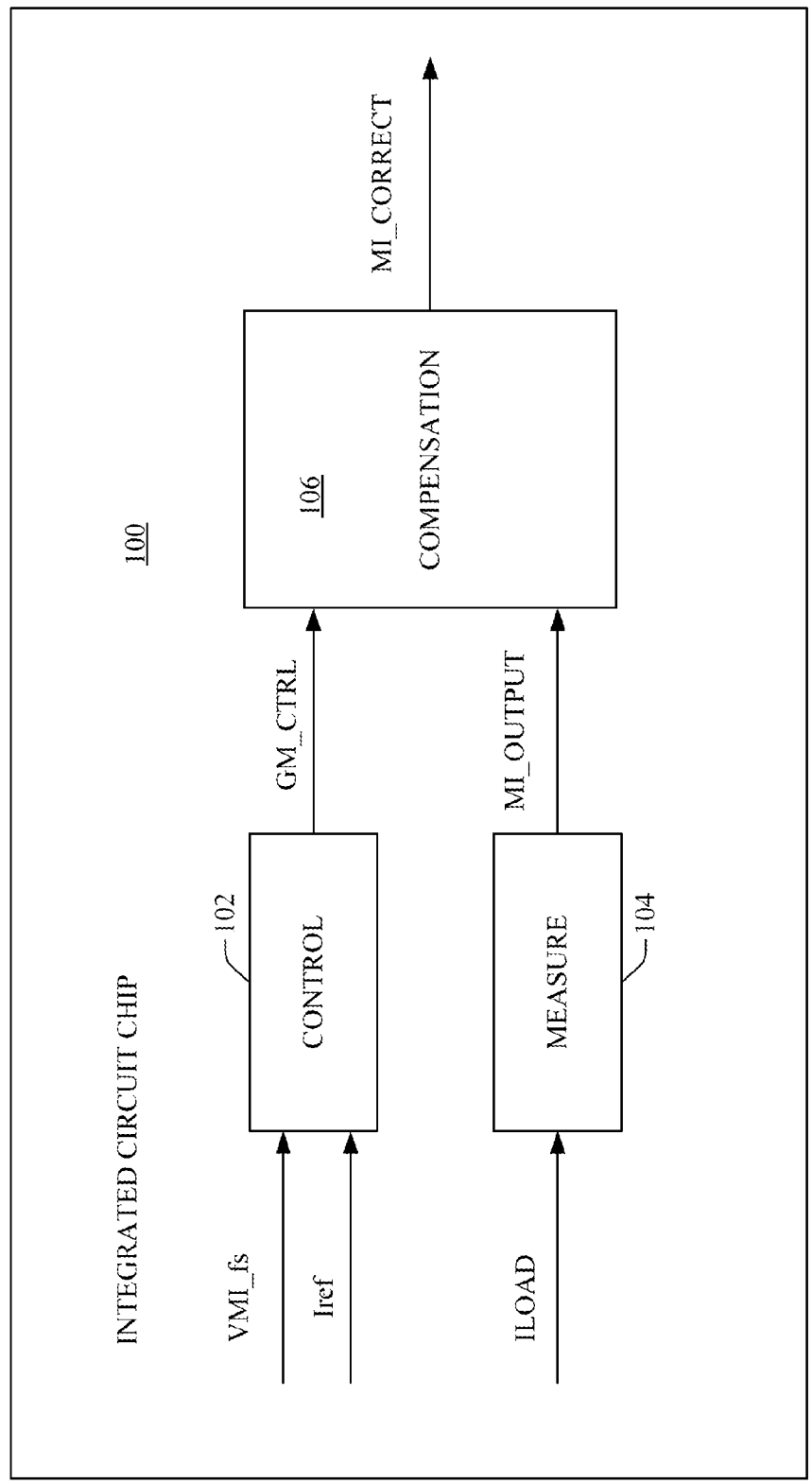
FIG. 1 illustrates high-level functional blocks for an example architecture according an embodiment of the present invention.

The embodiments of the present invention relate to accurately measuring currents using on-chip sense resistors, and specifically to adaptively compensating for errors resulting from changes in the resistances of the on-chip sense resistors caused by process and temperature changes. Applications for the embodiments of the present invention can include Precision Parametric Measurement Units (PPMU) of Automatic Test Equipment (ATE). A PPMU is used during device testing to measure parameters such as voltages and currents at a device pin, and to regulate such parameters. The PPMU attempts to ensure that during testing, proper parameter values are applied to the Device Under Test (DUT).

According to an embodiment of the present invention, a control circuit including a replica resistor is provided. The control circuit causes a desired load current to flow through the replica resistor and generates a control signal indicative of the voltage drop across the replica resistor, which varies with changes in temperature and process conditions. A current sense circuit including the on-chip sense resistor senses the actual load current and generates an output signal indicative of the sensed current. The on-chip and replica resistors are made of the material having substantially the same properties and are located in close proximity to each other, such that any temperature and process variations would affect both resistors in substantially the same manner.

A compensation circuit is used to compensate for the effects of the process and temperature changes on the performance of the on-chip resistor over the entire full-scale load current range. The compensation circuit uses a highly linear transconductance (gm) stage. The gain of the linear gm stage is adjusted by using the control signal. The output signal generated by the current sense circuit is provided as an input to the linear gm stage. The compensation circuit uses the control signal to more accurately reflect the measured current 1.

The claimed subject matter is described with references to the drawings, wherein like reference numerals are used to refer to like elements throughout. In the following description, for purposes of explanation, numerous specific details and examples are set forth in order to provide a thorough understanding of the embodiments of the present invention. However, the embodiments of the present invention can be practiced without these specific details and are not limited by these specific details and examples. In addition, well-known structures and devices are shown in block diagram form in order to facilitate describing the claimed subject matter. Moreover, the word "exemplary" is used herein to mean serving as an example, instance, or illustration. Any aspect or design described herein as "exemplary" is not necessarily to be construed as preferred or advantageous over other aspects or designs. Rather, use of the word "exemplary" is intended to present concepts in a concrete fashion. Also, the word "coupled" is used herein to mean direct or indirect electrical or mechanical coupling.

FIG. 1 illustrates functional blocks for an integrated circuit chip (IC), according to an embodiment of the present invention. The IC 100 includes the Control Block 102, the Measure Block 104 and the Compensation Block 106. The Control Block 102 receives two input signals: a signal indicative of the desired voltage (e.g., desired full-scale voltage) for the Measure Block 104 (VMI_fs) and a signal indicative of the desired current (e.g., desired full-scale current) for the Measure Block 104 (Iref). The Control Block 102 generates the expected voltage (e.g., expected full-scale voltage) for the Measure Block 104 (VMI_ref) by causing the Iref current to flow through the replica resistor included in the Control Block 102. Based on the comparison between the VMI_fs and VMI_ref values, the Control Block 102 generates an output control signal (GM_CTRL) that is indicative of the value of the replica resistor. To generate these signals and perform the comparison, the Control Block 102 includes a precise current source, a linear transconductance (gm) amplifier with gain control, two operational amplifiers (Op-Amps) and a compensation resistor.

The Measure Block 104 includes at least one on chip sense resistor. The Measure Block 104 receives the actual load current (ILOAD) from an output stage and senses the load current by using the on-chip sense resistor. The Measure Block 104 generates an output signal (MI_output) that is indicative of the sensed current. The Measure Block 104 includes multiple operational amplifiers (op-amps) to generate the MI_output signal, which is proportional to the current flowing through the on chip sense resistor.

The replica resistor is substantially similar to the on chip resistor. The replica resistor can be laid out in the same (or substantially similar) material, in approximately the same location as the on chip resistor, with the same (or substantially similar) variation with sheet resistance in the process, and/or the same (or substantially similar) temperature coefficients. The term "substantially similar" as used herein with respect to the replica resistor means similar enough (e.g., in value, material composition, etc.) to the on chip resistor to cause variation in resistance of the replica resistor that is the same as, proportional to, and/or a scaled version of the variation in resistance of the on chip resistor.

Additionally or alternately, the term "substantially similar" can also mean differing in value by a known and/or specified offset value. The replica resistor can be a scaled version of the on on-chip resistor of the measure block 104 and can be internal to the chip. Furthermore, the term "approximately the same location" refers to any location near the on-chip resistor such that the on-chip and replica resistors experience the same or substantially the same environment and thus the same and/or substantially similar temperature/process changes.

On-chip resistors exhibit variations with a change in temperature and/or change in process, which lead to errors in current sensing. The variations are linear or close to linear. The temperature coefficient of resistance, a, can be expressed in parts per million (PPM)/degrees Celsius, and is defined by the following equation: $R_{T2}=R_{T1}\times[1+\alpha(T_2-T_i)]$; where $T_i$ can be the initial temperature, $T_2$ can be the final temperature, $R_{T1}$ can be the initial resistance, $R_{T2}$ can be the resistance at temperature $T_2$, and a can be the temperature coefficient. The value of $\alpha$ is not constant but can depend on the initial temperature on which the increment in resistance is based. For example, when the increment is based on the resistance measured at 0° C., then $\alpha$ can have a value of $\alpha_0$. At another initial temperature t° C., the value of $\alpha$ can be $\alpha_t$. Moreover, the temperature coefficient of resistance can be negative or positive.

The Compensation Block 106 receives the GM_CTRL and MI_output signals as inputs and uses the GM_CTRL signal to correct the error in the MI_output signal. The error in the MI_output signal results from the variation of the resistance value of the sense resistor, which is caused by the variations in the sheet resistance and the temperature. The Compensation Block 106 generates the corrected MI_output signal (MI_Correct) as output. The Compensation Component 106 includes a disparate linear transconductance (gm) amplifier with gain control, an operational amplifier and a compensation resistor. The gain of the linear gm amplifier can be set or adjusted by the control signal generated by Control Component 102, which is based on a change in the sheet resistance and/or temperature of the replica resistor. The Control Block 102, the Measure Block 104 and/or the Compensation Block 106 can be integrated together on a common IC 100 or can be implemented in multiple ICs (not shown).

Figure 2:
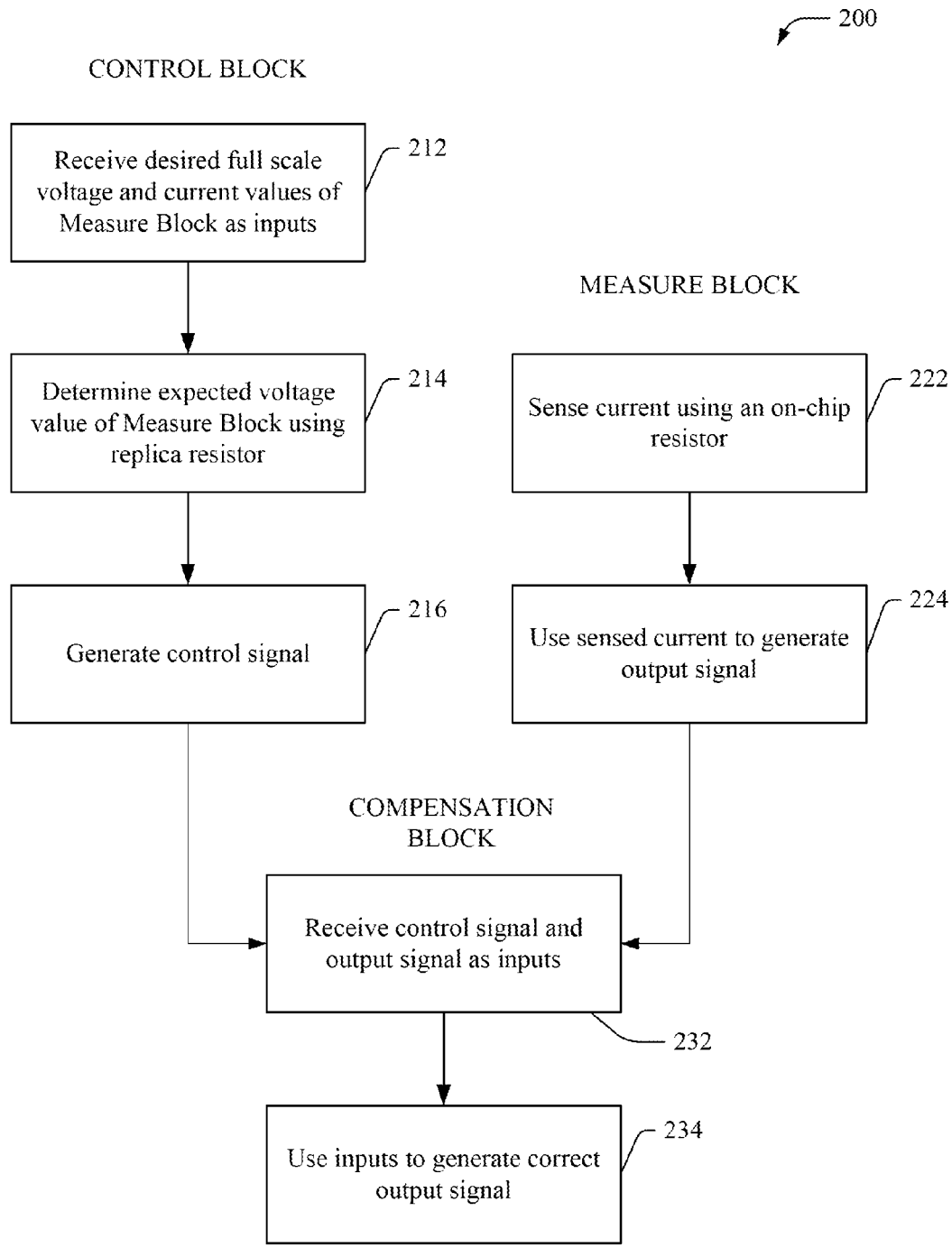
FIG. 2 illustrates an exemplary methodology according to an embodiment of the present invention.

FIG. 2 illustrates example methodologies for Control, Measure and Compensation Blocks, according to an embodiment of the present invention. According to the flow diagram 200, at step 212, the Control Block 102 receives two inputs: a signal indicative of the desired full-scale voltage value (VMI_fs) for the Measure Block 104 and a signal indicative of the desired full scale current (Iref) for the Measure Block 104. At Step 214, the expected voltage value across the sense resistor (VMI_ref) of the Measure Block 214 is determined by causing Iref to flow through the replica resistor included in the Control Block 102. At Step 216, the Control Block 102 generates an output control signal (GM_CTRL) based on the comparison between the VMI_fs and VMI_ref signals.

At Step 222, the Measure Block 104 measures the load current by using an on-chip sense resistor included in the Measure Block 104. At Step 224, the Measure Block 104 generates an output signal (MI_output) that is indicative of the sensed current.

At Step 232, the Compensation Block 106 receives the GM_CTRL and MI_output signals as inputs. At Step 234, the Compensation Block 106 generates an output signal (MI_correct) based on the values of the GM_CTRL and MI_output signals.

Figure 3:
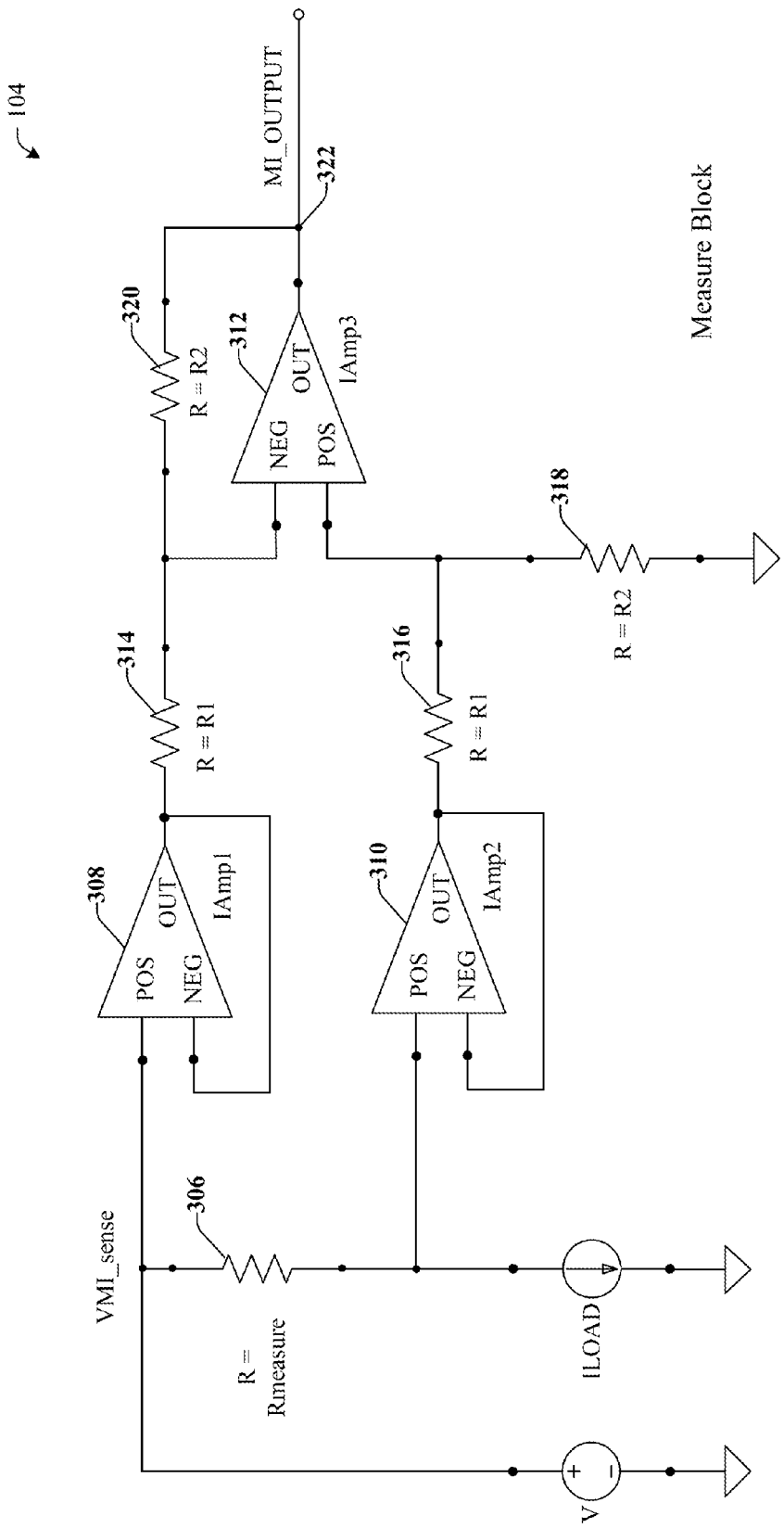
FIG. 3 illustrates an example implementation of the Measure Block.

FIG. 3 illustrates an example implementation of the Measure Block 104. The circuit 104 can measure the actual load current ILOAD by sensing the current in an output stage by using the on-chip resistor Rmeasure 306. The current sensed by Rmeasure 306 is referred to as the VMI_sense voltage. The operational amplifiers (Op-Amps) 308, 310 and 312 can be coupled with resistors 314, 316, 318 and 320, as illustrated in FIG. 3, to form an instrumentation amplifier circuit. An instrumentation amplifier is a type of differential amplifier that has been outfitted with input buffers, which eliminate the need for input impedance matching and thus make the amplifier particularly suitable for use in measurement and test equipment.

The resistors 314, 316, 318 and 320 can have suitable resistance values or ratios depending on the application. For example, as illustrated in FIG. 3, the resistors 314, 316, 318 and 320 can have values of R1 or R2, wherein R1 and R2 can be any suitable values of resistance and/or have any suitable ratio (e.g., 1:2, 2:1, etc.). The Op-Amps 308, 310 and 312 can be set to provide maximum gain, and the gain of the instrumentation amplifier can be adjusted by changing the resistance values of the resistors 314, 316, 318 and 320.

The circuit 104 generates an output voltage (VMI_output voltage) at node 322 that is proportional to the current through the resistor 306, which equals ILOAD. The VMI_output voltage can be calculated as follows: VMI_output=Iload×Rmeasure×(R2/R1)×(1+TC×DeltaT)×(1+DeltaRSH), where TC means temperature coefficient, DeltaT means change in temperature, and DeltaRSH means change in Sheet Rho. The temperature and process variations can cause errors in the currents sensed by using Rmeasure 306. According to an embodiment of the present invention, the Control Component 102 and the Compensation Component 106 are used to eliminate and/or minimize these errors. It is to be appreciated that the Measure Component 104 can be implemented using other current measurement circuits that do not include an instrumentation amplifier.

Figure 4:
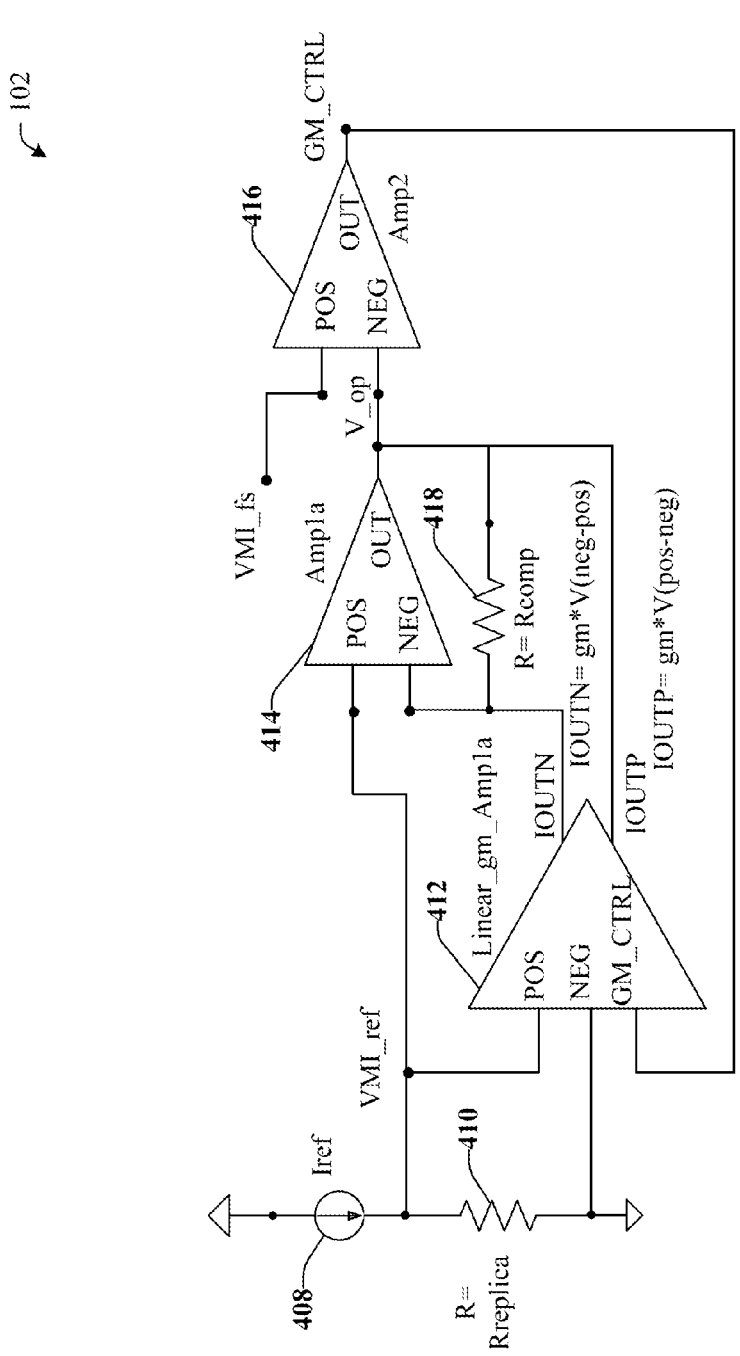
FIG. 4 illustrates an example implementation of the Control Block.

FIG. 4 illustrates an example implementation of the Control Block 102. The Control Block 102 facilitates the regulation of the process and temperature variations for an on chip sense resistor, according to an embodiment of the present invention. The circuit 102 includes an ideal and/or precise current source (Iref) 408, a replica measure resistor (Rreplica) 410, a linear transconductance amplifier with gain control (Linear_gm_Amp1a) 412 (also referred to herein as a linear gm amp, a transconductance amplifier, a gm amp, etc.), a first operational amplifier (Amp1a) 414, a second operational amplifier (Amp2) 416, and a compensation resistor (Rcomp) 418.

The Iref current 408 can be a scaled version of the full-scale current expected in the Measure Block 104. The Rreplica resistor 410 can be an on-chip resistor and can be a scaled version of the Rmeasure resistor 306. The circuit 102 can generate an output control signal referred to as GM_CTRL, wherein GM_CTRL can be utilized by the Compensation Block 106 to regulate variations, such as, but not limited to, process and/or temperature variations, for the sense resistor (Rmeasure) 306. The circuit 102 can leverage the two input signals, VMI_ref and VMI_fs, to generate the output control signal. The VMI_fs input is the desired full-scale voltage of the load for the Measure Block 104. The VMI_ref input is the expected voltage across the sense resistor (Rmeasure) 306 at the desired full scale current. VMI_fs and VMI_ref can include any suitable values in volts depending on the application. The GM_CTRL output can control the gain of the linear gm stage (linear_gm_amp1a) 412 and can also control the gain of a disparate linear gm stage 506 in the compensation component 106.

According to an embodiment of the present invention, the ideal/precise current source Iref 408 can be generated from an external resistor (e.g., one external resistor per chip). The ideal/precise current source Iref 408 can be a temperature stable current source. The resistor Rreplica 410 can be laid out in the same type of material as the sense resistor Rmeasure 306 and/or in approximately the same location as the sense resistor Rmeasure 306. It can be appreciated that the that resistors 410 and 306 are laid out in most any material of the same type (e.g., metal, alloy, element, etc.), for example, having the same or substantially similar electrical, thermal and/or mechanical properties. The resistor Rreplica 410 can have the same (or substantially similar) variation with sheet resistance in the process, and the same (or substantially similar) temperature coefficients as Rmeasure 306.

According to an embodiment of the present invention, the voltage at VMI_Ref can be a voltage that is proportional to the resistor Rreplica 410 (e.g., by employing Ohms Law, V=I×R). The value of Iref 408 is known and can be constant; however, the resistance of Rreplica 410 can vary based on various factors, such as, but not limited to, temperature and/or sheet resistance. Accordingly, the VMI_op voltage can change with a change in the various factors. VMI_op can be buffered to an operation amplifier Amp1a 414. Initially, when the gain of the linear gm stage 412 is zero (e.g., Linear_gm_Amp1a 412 is open), the Op-Amp 414 can buffer the VMI_ref signal to the Op-Amp 416.

Furthermore, Op-Amp 416 can compare the desired full-scale voltage (VMI_fs) with the expected full-scale voltage (VMI_ref). The differences in these voltages can occur due to the variation in resistance of Rreplica (e.g., with process and temperature). If VMI_ref is less than VMI_fs, the GM_CTRL signal is positive, thus increasing the gain of the linear gm stage 412 until VMI_op is equal to VMI_fs. If VMI_ref is greater than VMI_fs, the GM_CTRL signal is negative, thus decreasing the gain of the linear gm stage 412 until VMI_op is equal to VMI_fs. The linear gm stage 412 can include negative gm as well as positive gm. Furthermore, although operational amplifiers 414 and 416 are used in the circuit 102 illustrated in FIG. 4, other circuits, components, and/or devices can also be employed to compare and/or amplify the difference (e.g., in voltage) between VMI_ref and VMI_fs.

To illustrate the operation of the Control Block 102 by way of an example, a measure current range is defined, wherein, +1 volt can be defined as corresponding to 1 ampere of current and −1 volt can be defined as corresponding to −1 ampere of current. When the Linear_gm_Amp1a 412 is open, VMI_ref can be buffered and compared to VMI_fs by using the Op-Amp 416. If the sheet resistance is low, the resistance of Rreplica 410 can be lower than an expected/ideal value, and accordingly the VMI_ref, which is designed to generate the same full-scale voltage of 1 volt, can actually be less than 1 volt (e.g., 0.8 volts). In that case, the Amp2 416 can compare VMI_ref with VMI_fs and drive the GM_CTRL signal high, thereby increasing the gm of the Linear_gm_Amp1a 412. As the value of the GM_CTRL voltage increases, the values of the output currents of IOUTN and IOUTP also increase. IOUTP can be a sourcing current and IOUTN can be a sinking current or vice versa. IOUTN and IOUTP can have the same value and be equal and opposite currents.

In this example, the input to the Linear_gm_Amp1a 412 would be 0.8 volts (from VMI_ref). When the gm of the Linear_gm_Amp1a 412 starts rising (e.g., due to an increase in the value of GM_CTRL), the voltage across the Rcomp resistor 418 would increase. The voltage across the Rcomp resistor 418 is defined as IOUT×Rcomp, which can be equal to 0.2 volts, wherein IOUT can be the magnitude of IOUTN or IOUTP. Accordingly, an offset is provided as an input to the Op-Amp 414, which can cause the output voltage of the Op-Amp 414 to increase. In this example, the output voltage of the Op-Amp 414 can be equal to the 0.8 volts+0.2 volts=1 volt. In this manner, the GM_CTRL can provide an offset to the input voltage of the Op-Amp 414 until the inputs to Op-Amp 416 are equal. When the inputs to the Op-Amp 416 are equal, the value of GM_CTRL will not change.

Although the above example describes a scenario wherein resistance of Rreplica 410 becomes lower than an ideal value due to temperature variation, a scenario wherein resistance of Rreplica 410 becomes higher than an ideal value is also possible. In that case, the value of GM_CTRL would be negative, which would result in a negative input voltage being provided to the Op-Amp 414. Accordingly, the output voltage of Op-Amp 414 would be adjusted such that the inputs to Op-Amp 416, specifically, the output voltage of Op-Amp 414 and VMI_fs, become equal.

The voltage across Rcomp 418, i.e. IOUT×Rcomp, can change throughout the linear and rest of the full-scale current range. For example, at the VMI_ref value of 0V, the output current IOUTP can be 0 Amps. At the VMI_ref value of 0.8V, the Linear_gm_Amp1a 412 can output enough current, IOUTP (or IOUTN), to make the voltage across Rcomp 418 equal to 0.2V, whereas at the VMI_ref value of −0.8V, the Linear_gm_Amp1a 412 can output enough current, IOUTP (or IOUTN), to cause the voltage across Rcomp 418 to be equal to −0.2V. According to an embodiment of the present invention, the VMI_ref value is set according to a predetermined value of Iref.

Figure 5:
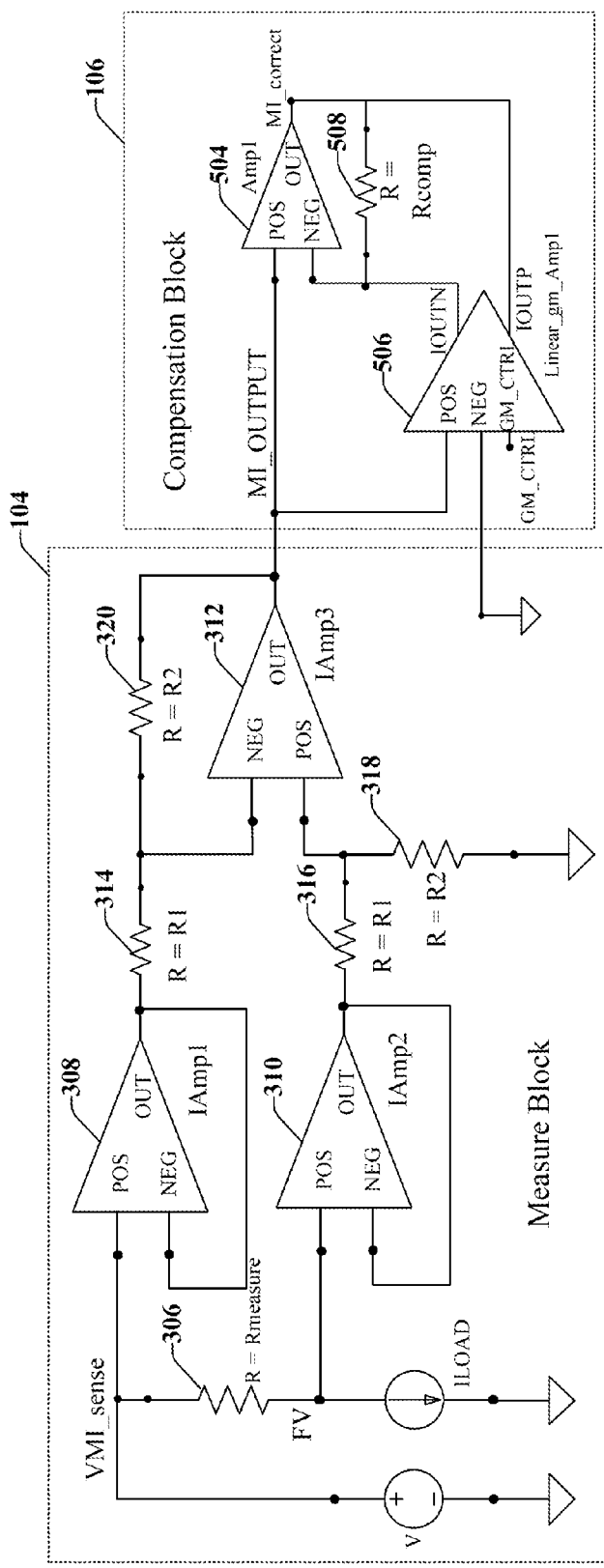
FIG. 5 illustrates an example implementation of the Measure Block coupled to the Compensation Block.

FIG. 5 illustrates an example implementation of the Compensation Block 106 coupled to the Measure Block 104. The Compensation Block 106 is used to modify the output voltage (MI_output) generated by the Measure Block 104. Moreover, the output voltage (MI_output) is proportional to the current ILOAD flowing through the resistor Rmeasure 306 and the resistance of the resistor Rmeasure 306. As the value of the resistance of Rmeasure 306 changes, for example, with variations in temperature, processes, etc., the output voltage (MI_output) also changes. The compensation circuit 106 can adjust (e.g., add/subtract to) the output voltage (MI_output) to negate the effect of resistance changes.

The compensation circuit 106 includes a linear transconductance amplifier with gain control (Linear_gm_Amp1) 506, an operational amplifier (Amp1) 504, and a compensation resistor (Rcomp) 508. The gain of the linear gm stage 506 is set by the GM_CTRL signal received from the Control Block 102, based on the sheet resistance and temperature of the on chip replica resistor (Rreplica) 410. The Linear_gm_Amp1 506 utilizes the GM_CTRL signal for controlling the gain. As current is sensed across the sense resistor (Rmeasure) 306, a proportional current can be generated by the linear gm stage (Linear_gm_Amp1) 506, which can add/subtract a voltage to the MI_output to correct and/or compensate for variations, such as, but not limited to, sheet resistance and/or temperature changes at resistor Rmeasure 306.

MI_output can be scaled such than it can become equal to ILOAD×Rmeasure (using Ohms Law). For example, at full scale (wherein ILOAD is equal to a full scale that is expected), the MI_output can be at 0.8 volts (e.g., due to the variations at resistor Rmeasure 306). Moreover, the input of the Linear_gm_Amp1 506 can be 0.8 volts and the current out of the Linear_gm_Amp1 506 can be enough to make the voltage across the Rcomp 508 (V=I×Rcomp) to equal 0.2 volts. Moreover, the gain of the linear_gm_Amp1 506 can be controlled by the GM_CTRL signal in a manner such that the current out of the Linear_gm_Amp1 506 can be enough to set the voltage across the Rcomp 508 equal to 0.2 volts. Accordingly, in this example, the Amp1 504 can output a voltage MI_correct that can be equal to 1 volt. Thus, a full scale current ILOAD can provide a full-scale output voltage (MI_correct).

The following equations illustrate theories supporting the embodiments of the present invention. In the below analysis, for the purposes of illustration only, it is assumed that the amplifiers are ideal and the resistors are of like material, and match in absolute value and temperature coefficient. It is also assumed that R2=R1 and therefore the gain of the instrumentation amplifier in circuit 104 is equal to 1. It is also assumed the linear gm stage (e.g., 506) can be ideally linear. These assumptions are valid and proven below, and the circuits 102 and 106 rely upon them to attempt to cancel first order temperature coefficients and/or sheet resistance variations for the sense resistor 306. These assumptions are not limiting on the embodiments of the present invention, values, etc.

Referring to FIG. 4, with respect to the Control Block 102, if the inputs to the Op-Amp 416 are equal, then:

$$\text{Vmi\_ref} + IOUTP \times Rcomp = \text{Vmi\_fs};$$

from the circuit $$Ioutp = \frac{(\text{Vmi\_fs} - \text{Vmi\_ref})}{Rcomp};$$

solving for IOUTP.

The gain of the linear amplifier, Linear_gm_Amp1a 412 is defined as follows:

$$Gm = \frac{IOUTP}{\text{Vmi\_ref}} = \frac{(\text{Vmi\_fs} - \text{Vmi\_ref})}{(Rcomp \times \text{Vmi\_ref})};$$

Theory and substitution

Referring to FIG. 5, with respect to the Measure Block 104 and the Compensate Block 106, the following equations define VMI_correct:

$$Vmi\_\text{Correct} = Vmi\_\text{sense} + (Vmi\_\text{sense} \times Gm \times Rcomp); \text{ from circuit}$$

$$vmi\_\text{Correct} = Vmi\_\text{sense} + Vmi\_\text{sense} \times \frac{(\text{Vmi\_fs} - \text{Vmi\_ref})}{(Rcomp \times \text{Vmi\_ref})} \times Rcomp;$$

substitution

Cancellation and factoring gives:

$$Vmi\_\text{Correct} = Vmi\_\text{sense} + \frac{(Vmi\_\text{sense} \times Vmi\_fs)}{Vmi\_\text{ref}} - \frac{(Vmi\_\text{sense} \times Vmi\_\text{ref})}{Vmi\_\text{ref}}$$

This can be reduced to the following:

$$Vmi\_\text{Correct} = \frac{(Vmi\_\text{sense} \times Vmi\_fs)}{Vmi\_\text{ref}}$$

Expressing the above into terms of temperature and Delta sheet rho (DELTARSH), the result is the following:

$$Vmi\_\text{Correct} = \frac{[Iload \times Rmeasure \times (1 + TC \times TEMP) \times (1 + DELTARSH) \times Vmi\_fs]}{[Iref \times Rreplica \times (1 + TC \times TEMP) \times (1 + DELTARSH)]}$$

Taking the Derivative with respect to Temperature or RSH will give zero. Hence, the above equation proves that there is no change in output voltage (e.g., MI_correct) with a change in temperature and/or sheet rho.

The embodiments of the present invention use linear circuits including linear gm amplifiers in order to compensate for the temperature and/or process variations. It is to be appreciated that the linear gm amplifiers described herein (e.g., Linear_gm_Amp1a 412, Linear_gm_Amp1 506, etc.) are very linear. The linear gm amplifiers can be defined by the equation $I_{OUT}=gm \times V_{IN}$, wherein, $I_{OUT}$ is the output current of the linear gm amplifier, $V_{IN}$ is the voltage at the input of the linear gm amplifier and gm is the gain of the linear gm amplifier. Based on the linear gm amplifiers being linear, the output current will be proportional to the gain across the range from the negative end (e.g., −0.8 V) to the positive end (e.g., 0.8 V), and the output current changes linearly with the input voltage. Moreover, Rmeasure 306 is very linear regardless of changes from process variation and/or temperature variation and thus linear gm amplifiers that are highly linear are used in the embodiments of the present invention. Because the overall measurement of the current is the sum of the Rmeasure 306×ILOAD and Rcomp×the IOUT of the Linear_gm_Amp 412, the overall linearity will depend on the sum of the linearity errors of these two components.

Figure 6:
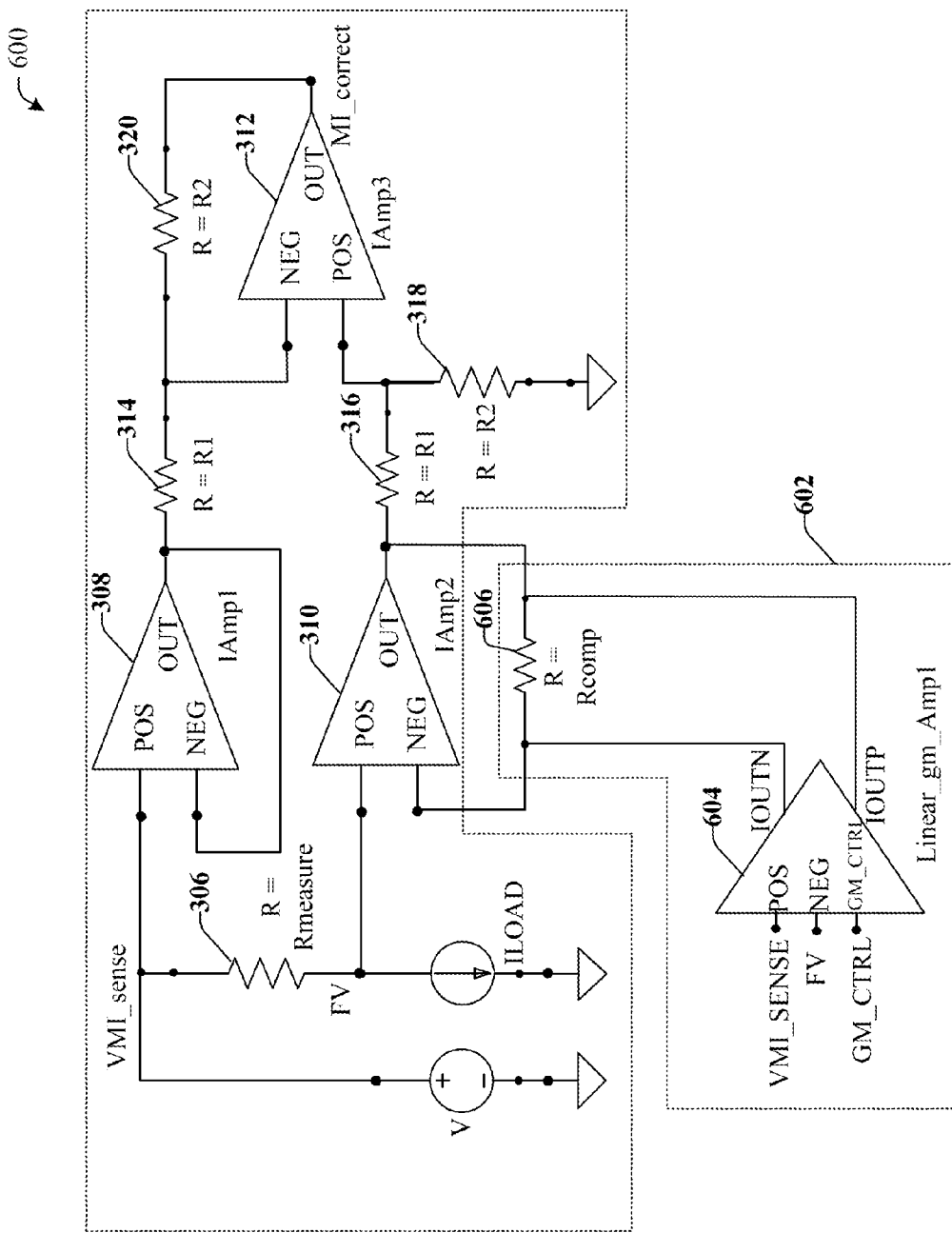
FIG. 6 illustrates an alternate circuit implementation according to an embodiment of the present invention.

FIG. 6 illustrates an example system 600 that facilitates linearly calibrating an on chip resistor affected by a process variation and/or a temperature variation, according to an embodiment of the present invention. The system 600 includes a circuit arrangement that is very similar to the Measure Block 104 including the on chip resistor Rmeasure 306. The system 600 also includes a compensation circuit 602 that provides a fast approach to compensate for the error included in the sensed current measured across the resistor Rmeasure 306. In particular, the compensation circuit 602 uses a single linear gm amplifier (Linear_gm_Amp1) 604 and thus reduces the components used for compensation compared to the Compensation Block 106, and thus reduces the speed of the process of generating a corrected output voltage MI_correct.

The compensation circuit 602 includes a linear gm stage 604. The linear gm amplifier 604 is coupled to the Rmeasure resistor 306. The compensation circuit 602 measures the voltage directly across the Rmeasure resistor 306 with the Linear_gm_Amp1 604 (e.g., measuring voltage at VMI_sense and FV). Based on factors such as, but not limited to, process and/or temperature variation, the voltage across Rmeasure resistor 306 can vary and cause an error in the output voltage measurement. The GM_CTRL signal (e.g., generated by Control Block 102) is used to control the gain of the Linear_gm_Amp1 604. The compensation resistor Rcomp 606 is incorporated into the amplifier's (IAmp2) 310 feedback path and the linear gm currents IOUTN, IOUTP flow through the resistor Rcomp. An offset voltage is provided by the Linear_gm_Amp1 604 by causing its output current to flow through the resistor Rcomp 606. The linear gm stage 604 can provide voltage offsets for both positive and negative gms.

Figure 7:
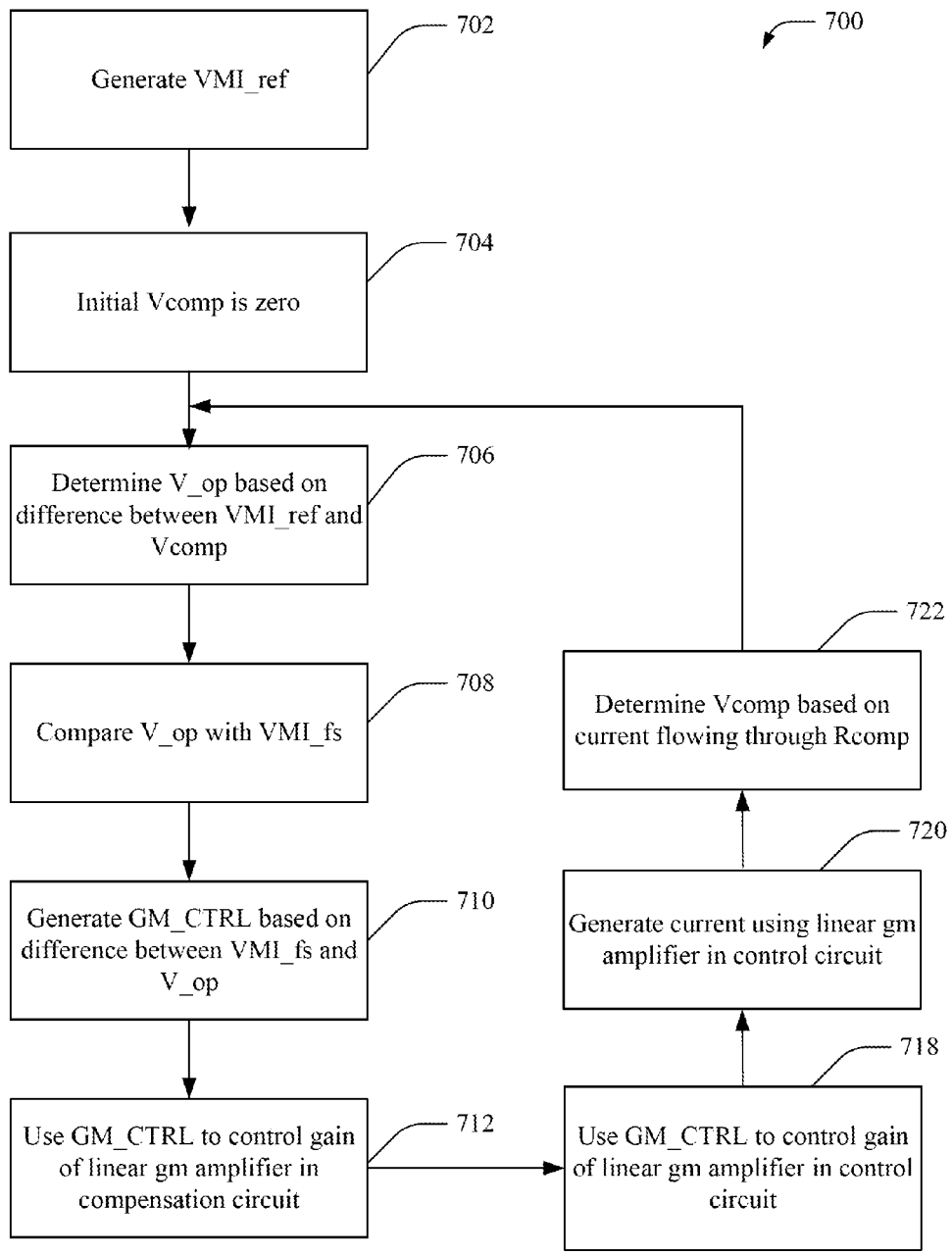
FIG. 7 illustrates an example methodology for generating a control signal.
Figure 8:
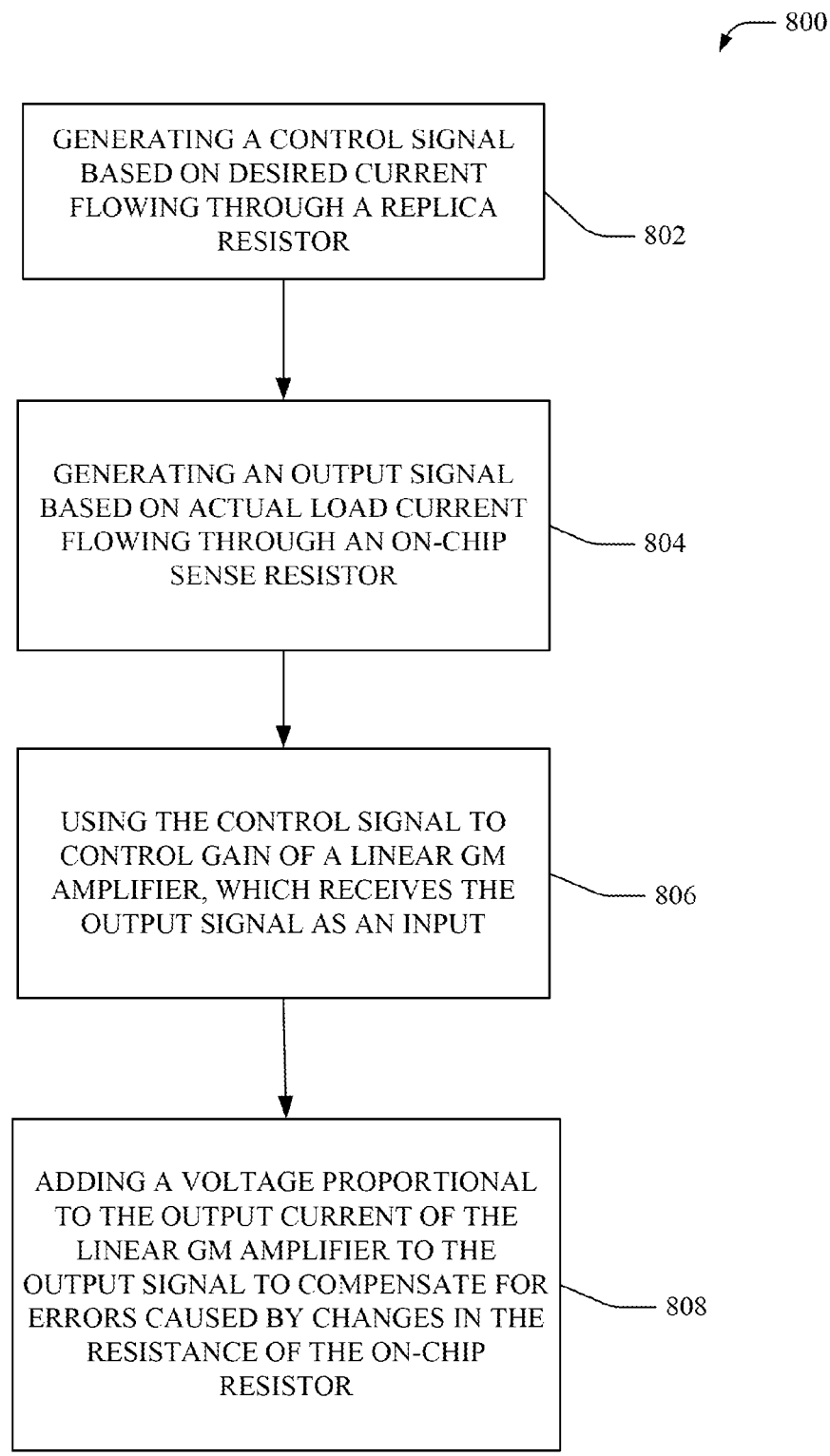
FIG. 8 illustrates an example methodology for correcting a signal indicative of the sensed actual load current.
Figure 9:
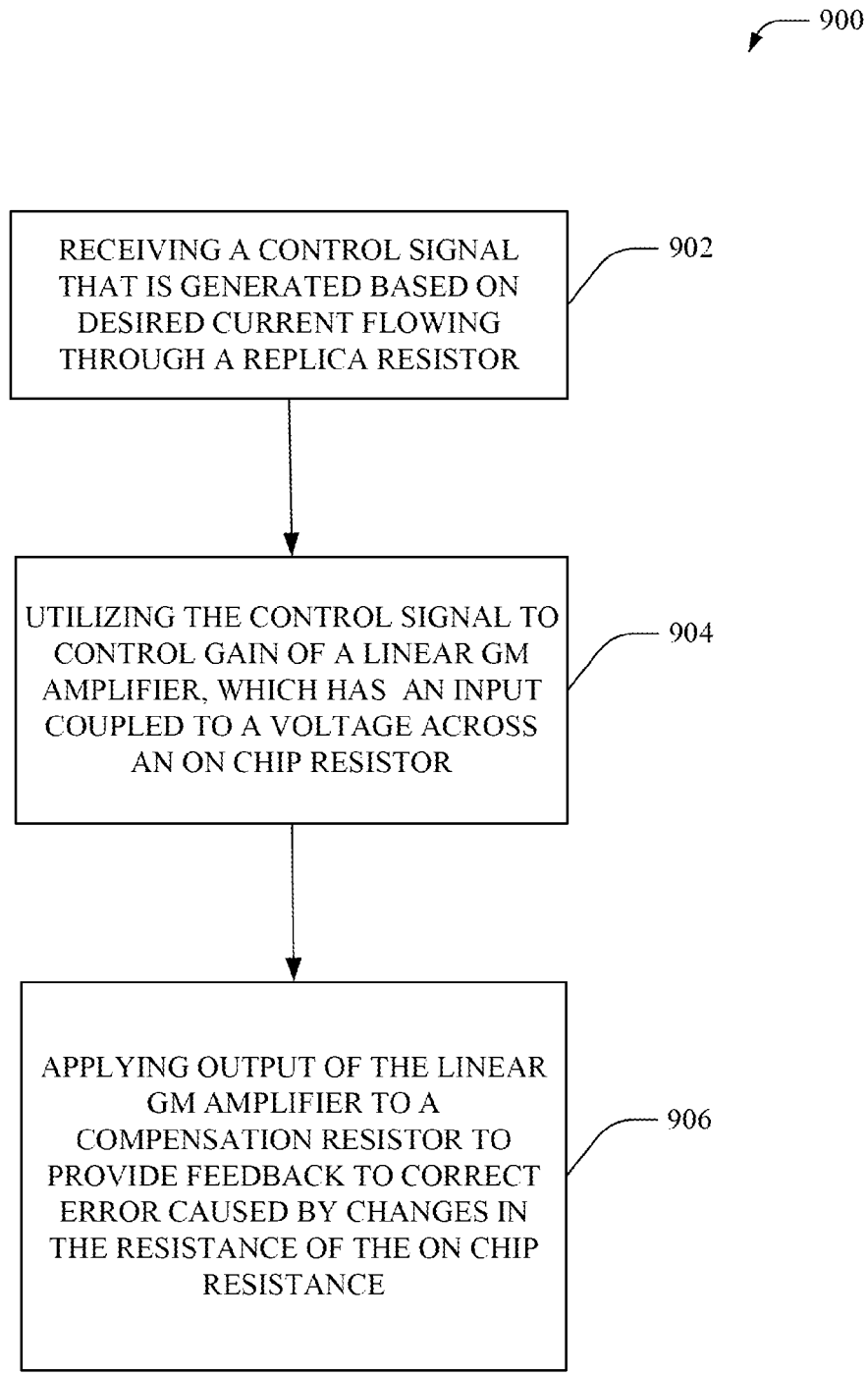
FIG. 9 illustrates an example methodology for the Compensation Block.

FIGS. 7-9 illustrate methodologies and/or flow diagrams in accordance with embodiments of the present invention. For simplicity of explanation, the methodologies are depicted and described as series of acts/steps. It is to be understood and appreciated that the embodiments of the present invention are not limited by the acts/steps illustrated and/or by the order of acts/steps. For example, acts/steps can occur in various orders and/or concurrently, and with other acts not presented and described herein. Furthermore, not all illustrated acts may be required to implement the methodologies in accordance with the disclosed subject matter. Additionally, it should be further appreciated that the methodologies disclosed hereinafter and throughout this specification are capable of being implemented on an article of manufacture to facilitate transporting and transferring such methodologies.

FIG. 7 illustrates is an example methodology for generating a control signal that facilitates regulating process and temperature variations for an on chip resistor, according to an embodiment of the present invention. According to the flow diagram 700, at Step 702, The Control Block 102 generates the VMI_ref voltage across the Rreplica 410 replica resistor by causing an ideal full-scale current Iref 408 to pass through Rreplica 410. VMI_ref is thus proportional to the resistance of the Rreplica resistor, which can vary with changes in temperature. At Step 704, the Vcomp voltage across the Rcomp compensation resistor 418 of the Control Block 102 is initially zero, which means that no current initially flows through the Rcomp resistor 418.

At Step 706, the Op-Amp 414 of the Control Block 102 compares the VMI_ref and Vcomp values and generates the output voltage (V_op). At Step 708, the Op-Amp 416 of the Control Block 102 compares V_op with VMI_fs. VMI_fs is the desired full-scale voltage of the circuit that measures current through the on chip sense resistor, i.e. the Measure Block 104. As a result of the comparison, at Step 710, the GM_CTRL signal is generated based on the difference between the VMI_fs and VMI_op values. At Step 712, the GM_CTRL signal is used to control the gain of the linear gm amplifier (with gain) 506 in the Compensation Block 106. The Compensation Block 106 uses the GM_CTRL signal to provide an offset voltage that can negate the effects of temperature/process variations on the on chip resistor.

At Step 718, the GM_CTRL signal is used to control the gain of a disparate linear gm amplifier (with gain) 412 included in the Control Block 102. The amplifier 412 receives VMI_ref as an input. At Step 720, the disparate linear gm amplifier 412 generates current, which includes an offset based in part on the value of the GM_CTRL signal. At Step 722, the Vcomp voltage is determined based on the output current flowing thought the Rcomp resistor 418. Steps 706-712 are then repeated until V_op and VMI_fs values become equal.

FIG. 8 illustrates an example methodology that regulates process and/or temperature variations for an on chip resistor, according to an embodiment of the present invention. At Step 802, a control signal is generated by causing a desired full-scale load current to flow through a replica resistor. At Step 804, an output signal is generated by causing an actual full-scale load current to flow through an on-chip sense resistor. The replica resistor can be the same or substantially similar to the on chip resistor in terms of material, sheet resistance, temperature coefficients and the like. Further, the replica resistor can be located in approximately the same location and/or in close proximity with as the on chip resistor. The current flowing through the replica resistor can be generated by using a constant, ideal (or almost ideal) and/or precise current source. At Step 806, the control signal is used to control a gain of a second linear gm amplifier, which receives output signal as an input. At Step 808, a voltage proportional to the output current of the second linear gm amplifier is added to the output signal to compensate for the errors caused by changes in resistance (e.g., due to temperature and/or process variations) of the on-chip resistor.

FIG. 9 illustrates is an example methodology that linearly calibrates an on chip resistor affected by a process variation and/or a temperature variation, according to an embodiment of the present invention. At Step 902, a control signal generated by causing a desired full-scale load current to flow through a replica resistor is received. At Step 904, the control signal is utilized to control the gain of a disparate linear gm amplifier, which receives as an input the voltage across the on chip sense resistor. The on chip sense resistor senses the actual load current. As discussed previously, the replica resistor is substantially similar and located in close proximity to an on chip resistor. At Step 906, the current output of the linear gm amplifier is applied to the compensation resistor Rcomp. Rcomp can be included in a feedback loop to provide a correction for error caused by variations in the resistance value of the on chip resistor.

The Rcomp resistor can be added in the feedback path of an Op-Amp of the current sensing circuit that measures actual load current by using the chip resistor. The current sensing circuit can comprise an instrumentation amplifier circuit that includes the Op-Amp. The output current from the disparate linear gm amplifier can flow through the Rcomp to provide a compensation voltage across the Rcomp. The linear gm amplifier can produce positive and/or negative gm. The applied gain can provide a corrected output voltage at the output of the current sense circuit (e.g., instrumentation amplifier), which is proportional to the full range of current that is flowing through the on chip resistor.

The components and circuitry elements described above can be of any suitable value in order to implement the embodiments of the present invention. For example, the resistors can be of any suitable resistance, amplifiers can provide any suitable gain, current sources can provide any suitable amperage, etc. The resistors Rmeasure, Rreplica, R1, R2, Rcomp, and the like can be of any suitable value and/or have any particular ratios between one another. Moreover, the amplifiers (e.g., Amp1, Amp2, Amp1a, IAmp1, IAmp2, IAmp3, Linear_gm_amp1a, Linear_gm_amp1, etc.) can include any suitable gain.

Figure 10:
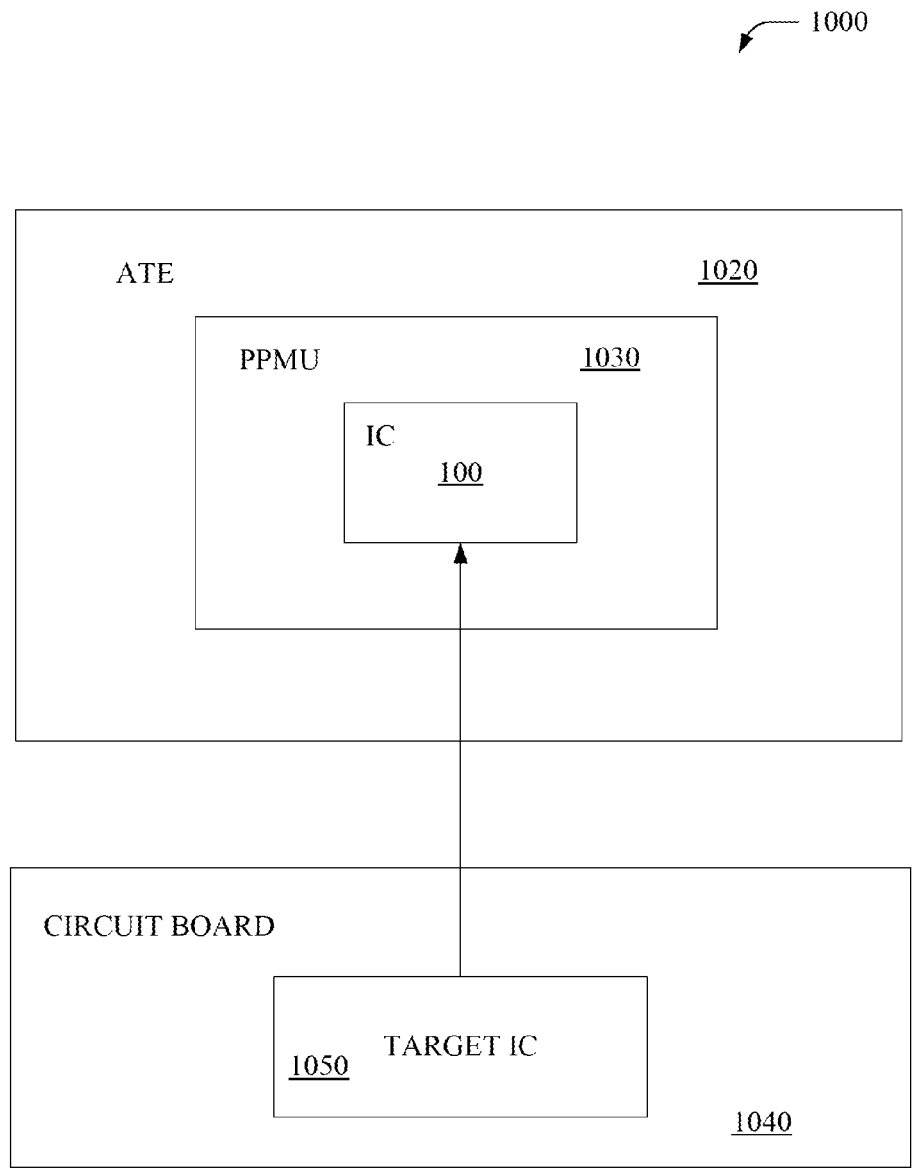
FIG. 10 illustrates an example system in which the embodiments of the present invention can be implemented.

FIG. 10 illustrates an example system in which the embodiments of the present invention can be implemented. The system 1000 includes Automatic Test Equipment 1020 having a Precision Parametric Measurement Unit (PPMU) 1030. The PPMU 1030 includes the IC 100, which includes the Control, Measure and Compensate Blocks 102, 104 and 106, according to an embodiment of the present invention. The Target IC 1050 is situated on the circuit board 1040 and is coupled to the IC 100. Specifically, the Target IC 1050 is tested by the ATE 1020. The Target IC 1050 provides the load current ILOAD to the Measure Block 104 and specifically to the Rmeasure resistor 306 located in the Measure Block 104. The Rmeasure resistor 306 is used for sensing the ILOAD current.

What has been described above includes examples of the embodiments of the present invention. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims.

The aforementioned systems/circuits have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

What is claimed is:

1. A method for measuring a load current with an on-chip resistor, the method comprising:
   generating an output voltage proportional to the load current flowing through the on-chip resistor;
   generating a control signal indicative of a resistance value of a replica resistor by causing a desired full-scale current to flow through the replica resistor, and comparing a voltage across the replica resistor with a desired full-scale voltage; and
   utilizing the control signal, adjusting the output voltage to account for a change in a resistance value of the on-chip resistor; wherein,
   a temperature coefficient of the replica resistor is substantially similar to a temperature coefficient of the on-chip resistor, the resistance value of the replica resistor varies in proportion with the resistance value of the on chip resistor, and the adjusted output voltage indicates a measure of the load current through the on-chip resistor.

2. The method of claim 1, wherein the adjusting the output voltage comprises controlling a gain of a linear transconductance amplifier utilizing the control signal.

3. The method of claim 2, further comprising:
   providing the output voltage as an input to the linear transconductance amplifier; and
   adding a voltage proportional to an output current of the linear transconductance amplifier to the output voltage.

4. The method of claim 2, further comprising: causing the current generated by the linear transconductance amplifier to flow through a compensation resistor for generating an offset voltage.

5. The method of claim 4, correcting an error including adding the offset voltage to the output voltage.

6. The method of claim 4, wherein the current generated by the linear transconductance amplifier changes linearly as a function of the output voltage.

7. The method of claim 1, wherein the output voltage is indicative of the resistance value of the on-chip resistance.

* * * * *